United States Patent
Valeri et al.

(10) Patent No.: US 10,163,434 B1
(45) Date of Patent: Dec. 25, 2018

(54) AUDIO CONTROL SYSTEMS AND METHODS BASED ON ROAD CHARACTERISTICS AND VEHICLE OPERATION

(71) Applicant: GM Global Technology Operations LLC, Detroit, MI (US)

(72) Inventors: Frank C. Valeri, Novi, MI (US); Scott M. Reilly, Southfield, MI (US); Roger C. Barlow, Jr., Brighton, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/633,110

(22) Filed: Jun. 26, 2017

(51) Int. Cl.
*G10K 15/02* (2006.01)
*H03G 3/20* (2006.01)
*H03G 9/00* (2006.01)

(52) U.S. Cl.
CPC .............. *G10K 15/02* (2013.01); *H03G 3/20* (2013.01); *H03G 9/005* (2013.01); *B60L 2270/42* (2013.01)

(58) Field of Classification Search
CPC ............ B60R 16/0237; B60W 40/068; B60W 50/0098; B60W 2550/402; B60W 40/06; B60W 2520/26; B60W 50/00; B60W 2550/12; B60W 2550/142; B60W 2550/148; B60W 40/075; B60W 2550/143; B60W 40/064; G10K 11/178; G10K 2201/1282; G10K 2210/12821; G10K 2210/3056; G10K 2210/3218; G10K 15/02; H04R 3/005; H04R 1/406; B60G 2400/91; B60G 2800/702; H03G 3/32; H03G 3/20; H03G 9/005

USPC ................... 381/86, 71.4, 56, 111, 120, 302
See application file for complete search history.

(56) References Cited

U.S. PATENT DOCUMENTS

| | | | | |
|---|---|---|---|---|
| 5,586,028 A * | 12/1996 | Sekine | ............... | B60T 8/17636 701/1 |
| 5,765,119 A * | 6/1998 | Otabe | .................... | B60T 8/172 701/59 |
| 5,852,243 A * | 12/1998 | Chang | ................ | B60R 16/0237 73/659 |
| 6,408,229 B1 * | 6/2002 | Loudon | ............... | B60G 17/018 340/438 |
| 8,618,921 B2 * | 12/2013 | Browne | .................. | B60Q 9/00 340/438 |
| 2004/0258254 A1 * | 12/2004 | Mollon | .................... | H04R 5/02 381/86 |
| 2011/0200199 A1 * | 8/2011 | Wakao | .................... | B60T 8/172 381/56 |

(Continued)

*Primary Examiner* — Yogeshkumar Patel

(57) ABSTRACT

A sound control module is configured to, based on a type of road over which a vehicle is traveling and a smoothness of the road, at least one of: determine a first frequency and a first increase at which to increase a first magnitude of a microphone signal; and determine a second frequency and a first decrease at which to decrease a second magnitude of the microphone signal. An audio driver module is configured to: receive the microphone signal from a microphone of the vehicle; generate an adjusted microphone signal by at least one of: increasing the first magnitude of the microphone signal at the first frequency based on the first increase; and decreasing the second magnitude of the microphone signal at the second frequency based on the first decrease; and apply power to a speaker of the vehicle based on the adjusted microphone signal.

20 Claims, 5 Drawing Sheets

(56) References Cited

U.S. PATENT DOCUMENTS

| | | | |
|---|---|---|---|
| 2012/0269358 A1* | 10/2012 | Gee | G10K 11/178 |
| | | | 381/71.4 |
| 2015/0137998 A1 | 5/2015 | Marti et al. | |
| 2015/0166072 A1* | 6/2015 | Powers | B60W 40/06 |
| | | | 701/1 |
| 2016/0163304 A1* | 6/2016 | Lee | G10K 11/1781 |
| | | | 381/71.4 |
| 2016/0221581 A1* | 8/2016 | Talwar | B60W 40/06 |
| 2017/0176196 A1* | 6/2017 | Powers | B60W 40/06 |
| 2017/0294180 A1* | 10/2017 | Hiraga | B60R 11/02 |
| 2018/0050698 A1* | 2/2018 | Polisson | B60W 30/182 |

* cited by examiner

AUDIO CONTROL SYSTEMS AND METHODS BASED ON ROAD CHARACTERISTICS AND VEHICLE OPERATION

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to vehicle audio systems and more particularly to systems and methods for producing audio within a passenger cabin based on characteristics of the road under a vehicle.

Some vehicles include conventional powertrains having an internal combustion engine and a drivetrain that normally emit sounds during vehicle operation. Many consumers have come to rely on these normal sounds as a sign of proper vehicle function. Changes in these normal sounds may indicate, to certain consumers, that the internal combustion engine and/or the drivetrain may be functioning differently than expected.

Some consumers may have expectations as to what the normal sounds of different types of vehicle should be. For example, a consumer may expect certain sounds from "high performance" vehicles, while some sounds may not be expected from other types of vehicles. An absence of expected sounds may detract from a user's enjoyment of a vehicle. Presence of unexpected vehicle sounds may also detract from a user's enjoyment of a vehicle.

SUMMARY

In a feature, an audio control system of a vehicle is described. A road module is configured to determine a type of road over which the vehicle is traveling and a smoothness of the road and to set a state of a road signal based on the type of the road and the smoothness of the road. A sound control module is configured to, based on the state of the road signal, at least one of: determine a first frequency and a first increase at which to increase a first magnitude of a microphone signal; and determine a second frequency and a first decrease at which to decrease a second magnitude of the microphone signal. An audio driver module is configured to: receive the microphone signal from a microphone of the vehicle; generate an adjusted microphone signal by at least one of: increasing the first magnitude of the microphone signal at the first frequency based on the first increase; and decreasing the second magnitude of the microphone signal at the second frequency based on the first decrease; and apply power to a speaker of the vehicle based on the adjusted microphone signal.

In further features, the road module is configured to determine the type of the road and the smoothness of the road based on a suspension acceleration signal measured by a suspension acceleration sensor of the vehicle.

In further features, the road module is configured to determine the type of the road and the smoothness of the road based on the suspension acceleration signal matching a predetermined suspension acceleration signal profile associated with the type of the road and the smoothness of the road.

In further features, the road module is configured to select the predetermined suspension acceleration signal profile from a group of predetermined suspension acceleration signal profiles based on the matching. Each predetermined suspension acceleration signal profile of the group of predetermined suspension acceleration signal profiles is associated with one road type and one type of smoothness.

In further features, the road module is configured to determine the type of the road and the smoothness of the road based on a global positioning system (GPS) location of the vehicle.

In further features, the road module is configured to determine the type of the road and the smoothness of the road using a database of road types and types of smoothness for a plurality of different GPS locations.

In further features, the sound control module is further configured to, based on the state of the road signal, at least one of: determine a third frequency and a second increase at which to increase a third magnitude of the microphone signal; and determine a fourth frequency and a second decrease at which to decrease a fourth magnitude of the microphone signal. The audio driver module is configured to further generate the adjusted microphone signal by at least one of: increasing the third magnitude of the microphone signal at the third frequency based on the second increase; and decreasing the fourth magnitude of the microphone signal at the fourth frequency based on the second decrease.

In further features, the sound control module is configured to, based on the state of the road signal, both: determine the first frequency and the first increase at which to increase the first magnitude of the microphone signal; and determine the second frequency and the first decrease at which to decrease the second magnitude of the microphone signal. The audio driver module is configured to generate the adjusted microphone signal by both: increasing the first magnitude of the microphone signal at the first frequency based on the first increase; and decreasing the second magnitude of the microphone signal at the second frequency based on the first decrease.

In further features, the sound control module is configured to determine the first frequency, the first increase, the second frequency, and the first decrease further based on a state of an audio mode.

In further features, when the audio mode is in a first state: the sound control module is configured to determine the first frequency and the first increase based on a first increase in a suspension acceleration signal within a first predetermined frequency range; and the sound control module is configured to determine the second frequency and the first decrease based on a second increase in the suspension acceleration signal within a second predetermined frequency range. When the audio mode is in a second state, the sound control module is configured to determine the first frequency and the first increase based on a third magnitude of the suspension acceleration signal at a third frequency that is less than a first predetermined magnitude on a predetermined suspension acceleration signal profile at the third frequency; and the sound control module is configured to determine the second frequency and the first decrease based on a fourth magnitude of the suspension acceleration signal at a fourth frequency that is greater than a second predetermined magnitude on the predetermined suspension acceleration signal profile at the fourth frequency.

In further features, the sound control module is configured to determine the predetermined suspension acceleration signal profile based on the state of the road signal.

In further features, the sound control module is configured to select the predetermined suspension acceleration signal profile from a group of predetermined suspension acceleration signal profiles, and each predetermined suspension acceleration signal profile of the group of predetermined suspension acceleration signal profiles is associated with one road type and one type of smoothness.

In further features, the sound control module is configured to select the predetermined suspension acceleration signal profile from a group of predetermined suspension acceleration signal profiles, and each predetermined suspension acceleration signal profile of the group of predetermined suspension acceleration signal profiles is associated with one road type and one type of smoothness.

In further features, when the audio mode is in the second state: the sound control module is configured to determine the first increase based on a difference between the third magnitude of the suspension acceleration signal at the third frequency and the first predetermined magnitude on the predetermined suspension acceleration signal profile at the third frequency; and the sound control module is configured to determine the first decrease based on the fourth magnitude of the suspension acceleration signal at the fourth frequency that is greater than the second predetermined magnitude on the predetermined suspension acceleration signal profile at the fourth frequency.

In further features, an audio mode module is configured to selectively set the audio mode to the second state during autonomous operation of the vehicle and to selectively set the audio mode to the first state during non-autonomous operation of the vehicle.

In further features, an audio mode module is configured to set the audio mode to one of the first state and the second state based on signal indicative of user input to set the audio mode to the one of the first state and the second state.

In further features, an audio mode module is configured to set the audio mode to one of the first state and the second state based on signal indicative of user input.

In further features, an audio mode module is configured to: determine whether the vehicle is being driven in a track state based on a lateral acceleration of the vehicle; set the audio mode to the first state when the vehicle is being driven in the track state; and set the audio mode to the second state when the vehicle is not being driven in the track state.

In a feature, an audio control method for a vehicle includes: determining a type of road over which the vehicle is traveling and a smoothness of the road; setting a state of a road signal based on the type of the road and the smoothness of the road; based on the state of the road signal and a state of an audio mode, at least one of: determining a first frequency and a first increase at which to increase a first magnitude of a microphone signal; and determining a second frequency and a first decrease at which to decrease a second magnitude of the microphone signal; receiving the microphone signal from a microphone of the vehicle; generating an adjusted microphone signal by at least one of: increasing the first magnitude of the microphone signal at the first frequency based on the first increase; and decreasing the second magnitude of the microphone signal at the second frequency based on the first decrease; and applying power to a speaker of the vehicle based on the adjusted microphone signal.

In further features, the audio control method further includes: when the audio mode is in a first state: determining the first frequency and the first increase based on a first increase in a suspension acceleration signal within a first predetermined frequency range; and determining the second frequency and the first decrease based on a second increase in the suspension acceleration signal within a second predetermined frequency range; and when the audio mode is in a second state: determining the first frequency and the first increase based on a third magnitude of the suspension acceleration signal at a third frequency that is less than a first predetermined magnitude on a predetermined suspension acceleration signal profile at the third frequency; and determining the second frequency and the first decrease based on a fourth magnitude of the suspension acceleration signal at a fourth frequency that is greater than a second predetermined magnitude on the predetermined suspension acceleration signal profile at the fourth frequency; and at least one of: selectively setting the audio mode to the second state during autonomous operation of the vehicle and selectively setting the audio mode to the first state during non-autonomous operation of the vehicle; selectively setting the audio mode to one of the first state and the second state based on signal indicative of user input to set the audio mode to the one of the first state and the second state; selectively setting the audio mode to one of the first state and the second state based on signal indicative of user input; and determining whether the vehicle is being driven in a track state based on a lateral acceleration of the vehicle and one of: selectively setting the audio mode to the first state when the vehicle is being driven in the track state; and selectively setting the audio mode to the second state when the vehicle is not being driven in the track state.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Vehicles travel over roads of different types (e.g., concrete, asphalt, aggregate, etc.) and that have different levels of smoothness (e.g., rough, smooth, etc.). The sound experienced within a vehicle due to the vehicle traveling over the road may vary based on the type of road and the smoothness of the road.

Using one or more speakers, an audio control module generates road sound within the vehicle based on an input signal from a microphone that is sensitive to sound produced due to the vehicle traveling over the road. Based on how the vehicle is being operated, however, different road sounds may enhance or detract from a user's aural experience.

According to the present disclosure, the audio control module therefore generates road sound within the vehicle based on operation of the vehicle. For example, during autonomous vehicle operation, a lack of changes in road sound may improve a user's aural experience. The audio control module may therefore adjust one or more magnitudes of the input signal from the microphone to provide a consistent road sound. As another example, during operation of the vehicle in a performance mode (e.g., at a track), the absence of some road sounds (e.g., low and high frequency road sounds) and the enhancement of other road sounds (e.g., mid-range frequency road sounds) may improve a user's aural experience. The audio control module may therefore adjust one or more magnitudes of the input signal to enhance and/or cancel predetermined frequencies of the input signal from the microphone.

Figure 1:
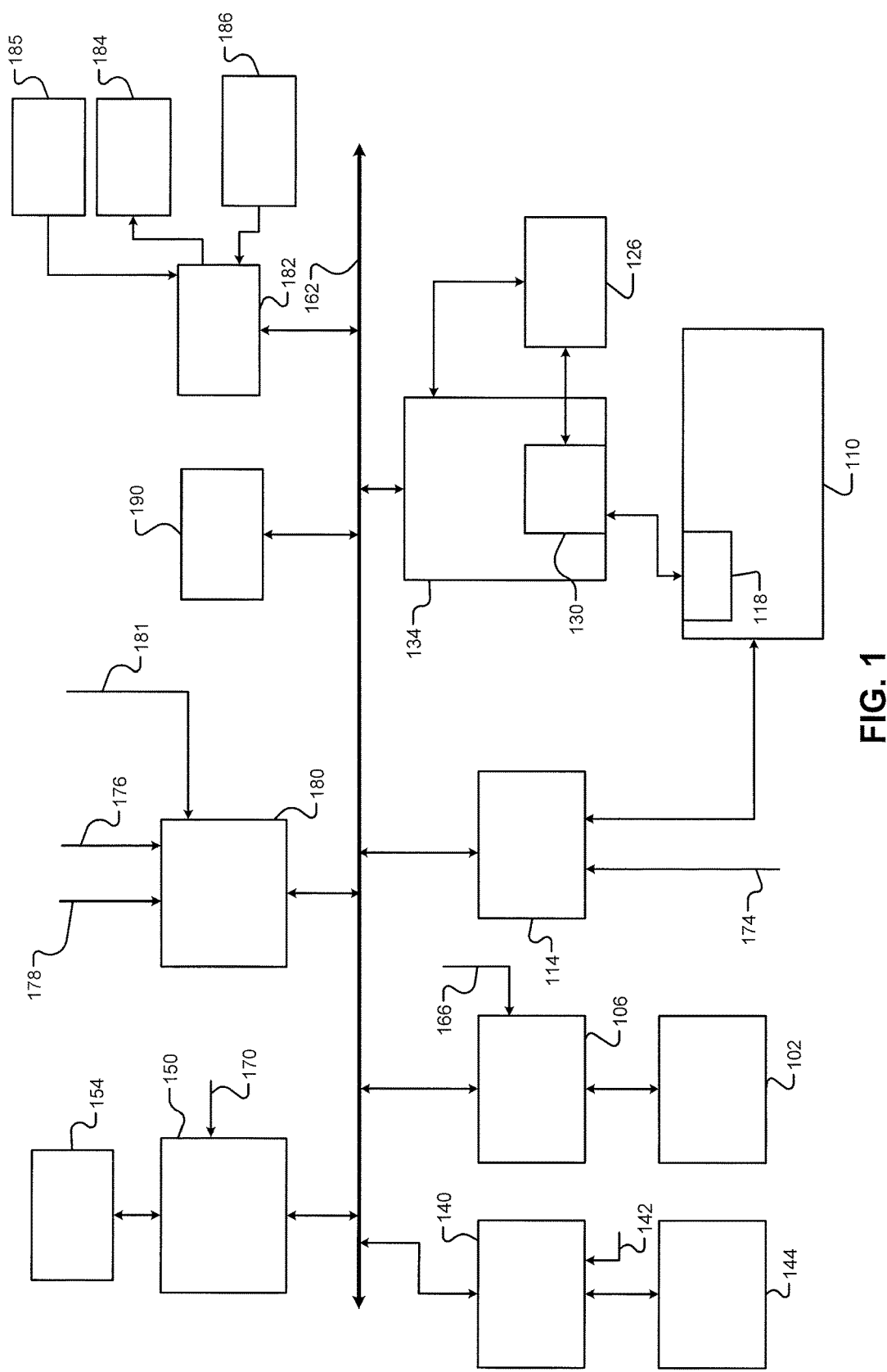
FIG. 1 is a functional block diagram including an example vehicle system.

Referring now to FIG. 1, a functional block diagram of an example vehicle system is presented. While a vehicle system for a hybrid vehicle is shown and will be described, the present disclosure is also applicable to non-hybrid vehicles, electric vehicles, fuel cell vehicles, and other types of vehicles. The present disclosure is also applicable to non-autonomous vehicles, semi-autonomous vehicles, and fully autonomous vehicles.

An engine 102 combusts an air/fuel mixture to generate drive torque. An engine control module (ECM) 106 controls the engine 102 based on a torque request. In various implementations, the ECM 106 may determine the torque request based on one or more driver inputs. For example, the ECM 106 may control actuation of engine actuators, such as a throttle valve, one or more spark plugs, one or more fuel injectors, valve actuators, camshaft phasers, an exhaust gas recirculation (EGR) valve, one or more boost devices, and other suitable engine actuators.

The engine 102 may output torque to a transmission 110. A transmission control module (TCM) 114 controls operation of the transmission 110. For example, the TCM 114 may control gear selection within the transmission 110 and one or more torque transfer devices (e.g., a torque converter, one or more clutches, etc.).

The vehicle system may include one or more electric motors. For example, an electric motor 118 may be implemented within the transmission 110 as shown in the example of FIG. 1. An electric motor can act as either a generator or as a motor at a given time. When acting as a generator, an electric motor converts mechanical energy into electrical energy. The electrical energy can be, for example, used to charge a battery 126 via a power control device (PCD) 130, such as an inverter. When acting as a motor, an electric motor generates torque that may be used, for example, to supplement or replace torque output by the engine 102. While the example of one electric motor is provided, the vehicle may include zero or more than one electric motor.

A power inverter control module (PIM) 134 may control the electric motor 118 and the PCD 130. The PCD 130 applies (e.g., direct current) power from the battery 126 to the (e.g., alternating current) electric motor 118 based on signals from the PIM 134, and the PCD 130 provides power output by the electric motor 118, for example, to the battery 126. The PIM 134 may be referred to as a power inverter module (PIM) in various implementations.

A steering control module 140 controls steering/turning of wheels of the vehicle, for example, based on driver turning of a steering wheel within the vehicle and/or steering commands from one or more vehicle control modules. A steering wheel angle sensor (SWA) monitors rotational position of the steering wheel and generates a SWA 142 based on the position of the steering wheel. As an example, the steering control module 140 may control vehicle steering via an EPS motor 144 based on the SWA 142. However, the vehicle may include another type of steering system.

An electronic brake control module (EBCM) 150 may selectively control mechanical brakes 154 of the vehicle. Modules of the vehicle may share parameters via a network 162, such as a controller area network (CAN). In vehicles a CAN can also be referred to as a car area network. For example, the network 162 may include one or more data buses. Various parameters may be made available by a given control module to other control modules via the network 162.

The driver inputs may include, for example, an accelerator pedal position (APP) 166 which may be provided to the ECM 106. A brake pedal position (BPP) 170 may be provided to the EBCM 150. The ECM 106 may determine the torque request and control actuation of the engine actuators based on the APP 166, the BPP 170, and/or one or more other parameters.

The TCM 114 controls gear selection within the transmission 110, for example, based on a range selector input 174 from a range selector, such as a park, reverse, neutral, drive lever (PRNDL) or another suitable type of transmission range selector. The range selector input 174 may be provided to the TCM 114.

The vehicle may include one or more suspension accelerometers, such as 3-axis gyroscopes, that generate suspension acceleration signals 176. For example, the vehicle may include one suspension accelerometer attached at each suspension load point of the vehicle. A suspension accelerometer measures lateral, longitudinal, and vertical acceleration at its location and generates the suspension acceleration signal accordingly.

An ignition state 178 may be provided to a body control module (BCM) 180. For example, the ignition state 178 may be generated based on input by a driver via an ignition key, button, or switch. At a given time, the ignition state 178 may be one of off, accessory, run, and crank. When the ignition state 178 transitions from off or accessory to crank, the BCM 180 generally closes a starter switch (e.g., relay). Closing of the starter switch engages a starter with the engine 102 and drives rotation of the starter. When the starter is engaged with the engine 102, rotation of the starter drives rotation of the engine 102 for starting of the engine 102.

The vehicle may include a latitudinal acceleration sensor and a longitudinal acceleration sensor. The latitudinal acceleration sensor measures latitudinal acceleration of the vehicle and generates a latitudinal acceleration signal accordingly. The longitudinal acceleration sensor measures longitudinal acceleration and generates the longitudinal acceleration signal accordingly. The latitudinal and longitudinal acceleration signals are collectively illustrated by 181.

The vehicle system also includes an audio control module 182. The audio control module 182 controls sound output by one or more speakers 184 located and outputting sound to within a passenger cabin (or compartment) of the vehicle. The audio control module 182 may control sound output by the speakers 184 based on signals indicative of user input from one or more other user input devices 185, such as one or more switches, buttons, knobs, touchscreen displays, etc. located within a passenger compartment of the vehicle. For example, the audio control module 182 may control a volume of sound output, tuning of one or more audio sources, and/or one or more other audio characteristics based on signals from the user input devices 185.

Additionally, the audio control module 182 outputs sound via the speakers 184 based on signals from a microphone 186 located within the passenger cabin of the vehicle. The microphone 186, however, may be sensitive to road noise. In other words, the microphone 186 may generate its signals based on sound attributable to the vehicle traveling over the road under the vehicle, such as sound due to contact between the tire and the road surface, sound attributable to suspension actuation, and/or one or more other sources of sound attributable to the vehicle traveling over the road.

User expectation as to the presence or absence of road sound, however, may differ based on driving situation, user, and/or one or more other parameters. For example, no round sound may be expected during autonomous vehicle use. Road sound, however, may be expected and may also be helpful when the driver is controlling vehicle operation (i.e., non-autonomous vehicle operation) at a track. According to the present disclosure, based on the road under the vehicle and the driving situation, the audio control module 182 selectively enhances frequencies in the signal from the microphone 186 and selectively cancels frequencies in the signal from the microphone 186. This may increase a user's perception of the aural experience of the vehicle.

A global positioning system (GPS) module 190 determines a GPS location of the vehicle based on signals from a plurality of GPS satellites. For example, the GPS module 190 may determine the GPS location of the vehicle using triangulation. Characteristics of the road may be determined, for example, based on one or more of the suspension acceleration signals 176 or the GPS location.

The audio control module 182 may receive parameters from the ECM 114, the hybrid control module 196, the TCM 114, and/or one or more other modules of the vehicle. The audio control module 182 may receive parameters from other modules, for example, via the network 162.

Figure 2:
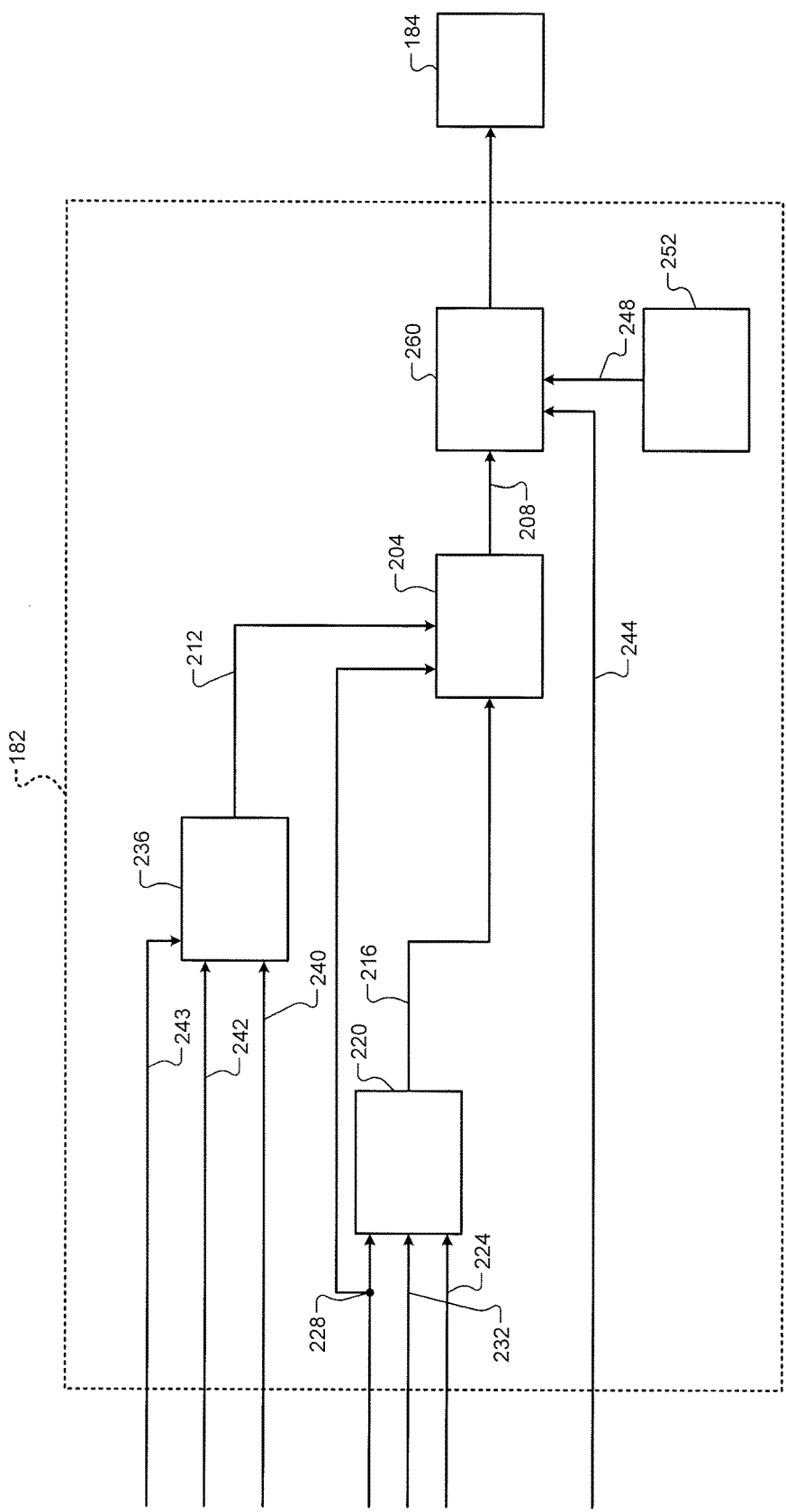
FIG. 2 is a functional block diagram including an example audio control module and speakers.

FIG. 2 is a functional block diagram of an example audio system including the audio control module 182 and the speakers 184. The speakers 184 output sound within the passenger cabin of the vehicle.

A sound control module 204 determines how to output road sound via the speakers 184 based on an audio mode 212 and characteristics of the road under the vehicle. More specifically, the sound control module 204 sets characteristics 208 for outputting sound for road sound based on the audio mode 212 and the characteristics of the road under the vehicle. At a given time, the audio mode 212 may be either a first state or a second state. The audio mode 212 and the characteristics 208 are discussed further below. The characteristics of the road include a type of the road (e.g., concrete, asphalt, aggregate, etc.) and a roughness of the road (e.g., smooth, medium, rough, etc.).

A road signal 216 indicates the characteristics of the road. For example, a road module 220 may set the road signal 216 to a first state when the road is concrete and smooth. The road module 220 may set the road signal 216 to a second state when the road is concrete and medium smoothness. The road module 220 may set the road signal 216 to a third state when the road is concrete and rough. The road module 220 may set the road signal 216 to a fourth state when the road is asphalt and smooth. The road module 220 may set the road signal 216 to a fifth state when the road is asphalt and medium smoothness. The road module 220 may set the road signal 216 to a sixth state when the road is asphalt and rough. The road module 220 may set the road signal 216 to a seventh state when the road is aggregate and smooth. The road module 220 may set the road signal 216 to an eighth state when the road is aggregate and medium smoothness. The road module 220 may set the road signal 216 to a ninth state when the road is aggregate and rough. While the example of three road types (concrete, asphalt, and aggregate) and three degrees of smoothness (smooth, medium, and rough) have been provided, the present application is also applicable to a greater or fewer number of different road types and a greater or fewer number of degrees of smoothness.

The road module 220 determines the characteristics of the road. For example, the road module 220 may determine the characteristics of the road based on a GPS location 224 from the GPS module 190. The road module 220 may determine the characteristics of the road based on the GPS location 224, for example, using a database of road characteristics indexed by location.

Additionally or alternatively, the road module 220 may determine the characteristics of the road based on a suspension acceleration 228 measured using a suspension acceleration sensor. The suspension acceleration sensors are described above. A profile of acceleration as a function of frequency may be stored in memory for each different combination of road type and smoothness. In the example of three road types and three degrees of smoothness, there may be 9 stored profiles of acceleration as a function of frequency, one profile for each combination of road type and smoothness. The road module 220 may determine the characteristics of the road, for example, as the characteristics associated with the one of the stored profiles that best fits the suspension acceleration 228.

In various implementations, the road module 220 may adjust the stored profiles based on a vehicle speed 232 before comparison with the suspension acceleration 228. For example, the road module 220 may filter the stored profiles to slow changes in acceleration as the vehicle speed 232 increases and vice versa. The vehicle speed 232 may be determined based on one or more wheel speeds measured by wheel speed sensors, respectively, such as an average of two or more wheel speeds.

An audio mode module 236 sets the audio mode 212 to one of the first state and the second state. When the audio mode 212 is set to the first state, the sound control module 204 sets the characteristics 208 in an effort to enhance road noise within predetermined frequency ranges and to cancel road sound within other predetermined frequency ranges. When the audio mode 212 is set to the second state, the sound control module 204 sets the characteristics 208 in an effort to minimize changes in road noise heard within the passenger cabin.

The audio mode module 236 may set the audio mode 212 according to a user audio mode 240. More specifically, the audio mode module 236 may set the audio mode 212 to the first state when the user audio mode 240 is set to the first state and set the audio mode 212 to the second state when the user audio mode 240 is set to the second state. The user audio mode 240 may be stored in memory of the vehicle and set by a user of the vehicle, such as via the user input devices 185 or one or more other user input devices.

In various implementations, the user audio mode 212 may be set to the first state or the second state via a device that is separate from the vehicle and communicated to the vehicle via a wireless network, such as a cellular, wireless (e.g., IEEE 802.11), or satellite network. Examples of separate devices include, but are not limited to, mobile phones, tablets, and other types of mobile computing devices.

In various implementations, the audio mode 212 may be set based on the type of vehicle operation. For example, the audio mode module 236 may set the audio mode 212 to the first state during non-autonomous operation set the audio mode 212 to the second state during semi-autonomous and autonomous operation.

Additionally or alternatively to the use of the user audio mode 240, the audio mode module 236 may set the audio mode 212 based on one or more other parameters. For example, the audio mode module 236 may set the audio mode 212 based on a drive mode 242.

The drive mode 242 may be set to one of track, normal, and economy using one or more input devices of the vehicle. The audio mode module 236 may set the audio mode 212 to the first state when the drive mode 242 is set to track and may set the audio mode 212 to the second state when the drive mode 242 is set to a mode other than track. While the examples of track, normal, and economy have been provided, a greater or lesser number of modes may be possible. The ECM 106 may control operation of the engine 102 based on a drive mode 242, and the TCM 114 may control operation of the transmission 110 based on the drive mode 242. One or more other control modules may also control operation of one or more other vehicle actuators based on the drive mode 242.

Additionally or alternatively to the use of the drive mode 242, the audio mode module 236 may set the audio mode 212 based on whether the driver of the vehicle is driving the vehicle in a track state or not. The audio mode module 236 may determine whether the driver is driving the vehicle in the track state, for example, based on the vehicle speed 232 and a lateral acceleration 243 of the vehicle. For example, the audio mode module 236 may determine that the vehicle is in the track state when the vehicle speed 232 is greater than a predetermined speed and the lateral acceleration 316 (e.g., a magnitude) is greater than a predetermined acceleration for at least a predetermined period. The audio mode module 236 may set the audio mode 212 to the first state when the vehicle is in the track state. The audio mode module 236 may set the audio mode 212 to the second state when the vehicle is not in the track state. Further information regarding determining whether the vehicle is being driven on a track state or not may be found in commonly assigned U.S. Pat. No. 6,408,229, which is incorporated herein in its entirety.

As described above, the sound control module 204 sets the characteristics 208 based on the audio mode 212 and the state of the road signal 216. The characteristics 208 include frequencies of a microphone signal 244 to enhance, frequencies of the microphone signal 244 to attenuate, and frequencies at which to add one or more of the predetermined tones 248. The characteristics 208 also include a magnitudes for frequencies to enhance, magnitudes for frequencies to attenuate, and magnitudes for frequencies at which to add one or more of the predetermined tones 248.

A frequency of the microphone signal 244 is enhanced by increasing an amplitude of the microphone signal 244 at that frequency. A frequency of the microphone signal 244 is attenuated by decreasing an amplitude of the microphone signal 244 at that frequency. The one or more predetermined tones 248 may be stored in tone memory 252.

The sound control module 204 may determine the characteristics 208, for example, using a lookup table of characteristics for each audio modes and each road signal state. For example, the lookup table may include a first set of characteristics for when the audio mode 212 is in the first state and a second set of characteristics for when the audio mode 212 is in the second state. The first set of characteristics may include first characteristics for the when the road signal 216 is in the first state, second characteristics for when the road signal 216 is in the second state, third characteristics for when the road signal 216 is in the third state, and so on. Similarly, the second set of characteristics may include first characteristics for the when the road signal 216 is in the first state, second characteristics for when the road signal 216 is in the second state, third characteristics for when the road signal 216 is in the third state, and so on. In this way, the sound control module 204 may set the characteristics 208 to the characteristics in the entry of the lookup table corresponding to the audio mode 212 and the road signal 216.

Alternatively to the use of the lookup table, when the audio mode 212 is in the first state, the sound control module 204 sets the characteristics 208 to enhance frequencies in the microphone signal 244 based on frequencies where increases (e.g., greater than a predetermined change) occur in the suspension acceleration signal 228 within a first predetermined frequency range of the suspension acceleration signal 228. When the audio mode 212 is in the first state, the sound control module 204 sets the characteristics 208 to attenuate frequencies in the microphone signal 244 based on frequencies where increases (e.g., greater than a predetermined change) occur in the suspension acceleration signal 228 within second and third predetermined frequency ranges. A lower boundary of the first predetermined frequency range is greater than an upper boundary of the second predetermined frequency range and an upper boundary of the first predetermined frequency range is less than a lower boundary of the third predetermined frequency range.

The sound control module 204 may also set the characteristics to add one or more of the predetermined tones 248 at frequencies of the microphone signal 244 at one or more frequencies within the first predetermined frequency range. The sound control module 204 may also set the characteristics to add one or more of the predetermined tones 248 at frequencies of the microphone signal 244 at one or more frequencies within the second and/or third predetermined frequency ranges. The sound control module 204 may determine the frequencies in the microphone signal 244 to enhance and to attenuate using a predetermined transfer function for converting from frequencies in the suspension acceleration signal 228 to frequencies of the microphone signal 244.

The sound control module 204 may determine the boundaries of the first, second, and third predetermined frequency ranges based on the road signal 216. For example, the sound control module 204 may determine the boundaries of the first, second, and third predetermined frequency ranges using a lookup table including boundaries for the first, second, and third predetermined frequency ranges indexed by state of the road signal 216.

Figure 3:
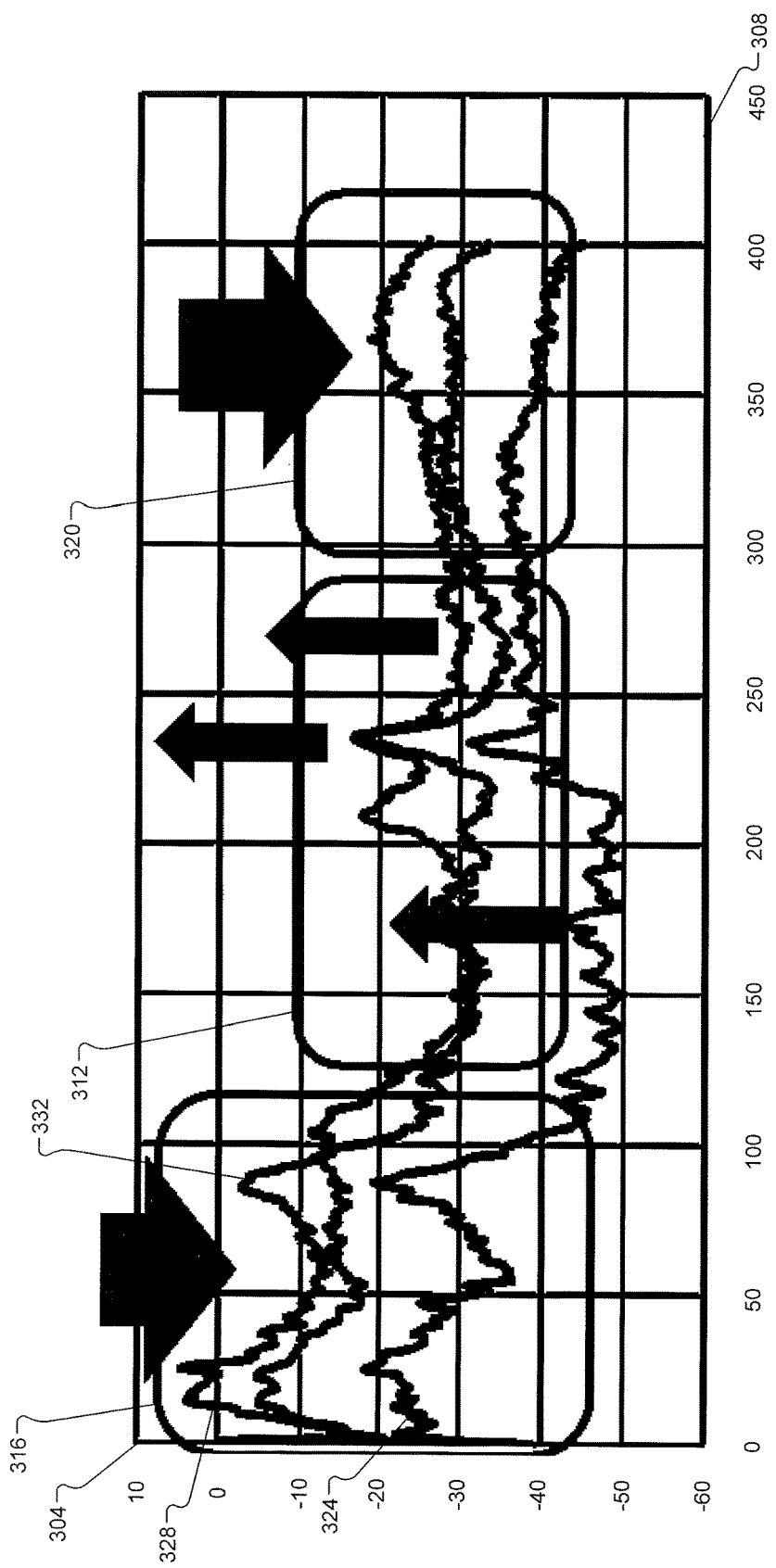
FIGS. 3 and 4 are example graphs of magnitude versus frequency.

FIG. 3 includes an example graph of magnitude of suspension acceleration 304 in decibels (dB) versus frequency 308 of the suspension acceleration for when the audio mode 212 is in the first state. FIG. 3 illustrates examples of the first, second, and third predetermined frequency ranges by 312, 316, and 320, respectively.

FIG. 3 includes three traces 324, 328, and 332 of suspension acceleration under three different road types and/or conditions. As illustrated, the sound control module 204 sets the characteristics 208 to enhance the microphone signal 244 at frequencies corresponding to frequencies within the first predetermined frequency range 312 and to attenuate the microphone signal 244 at frequencies within the second and third predetermined frequency ranges 316 and 320.

Referring back to FIG. 2, when the audio mode 212 is in the second state, the sound control module 204 sets the characteristics 208 to adjust frequencies in the microphone signal 244 based on adjusting frequencies in the suspension acceleration signal 228 toward a predetermined profile of magnitude as a function of frequency.

More specifically, for a frequency where the magnitude of the suspension acceleration signal 228 is less than (below) a magnitude on the predetermined profile at that frequency, the sound control module 204 sets the characteristics to adjust (increase) the suspension acceleration signal 228 toward that magnitude on the predetermined profile. For a frequency where the magnitude of the suspension acceleration signal 228 is greater than (above) a magnitude on the predetermined profile at that frequency, the sound control module 204 sets the characteristics to adjust (decrease) the suspension acceleration signal 228 toward that magnitude on the predetermined profile. The sound control module 204 sets the adjustments based on the differences between the magnitudes and the magnitudes on the predetermined profile at those frequencies, respectively. The sound control module 204 may determine the frequencies in the microphone signal 244 to enhance and to attenuate using a predetermined transfer function for converting from frequencies in the suspension acceleration signal 228 to frequencies of the microphone signal 244.

The sound control module 204 may determine the predetermined profile based on the road signal 216. For example, the sound control module 204 may determine the predetermined profile using a lookup table including predetermined profiles indexed by state of the road signal 216.

Figure 4:
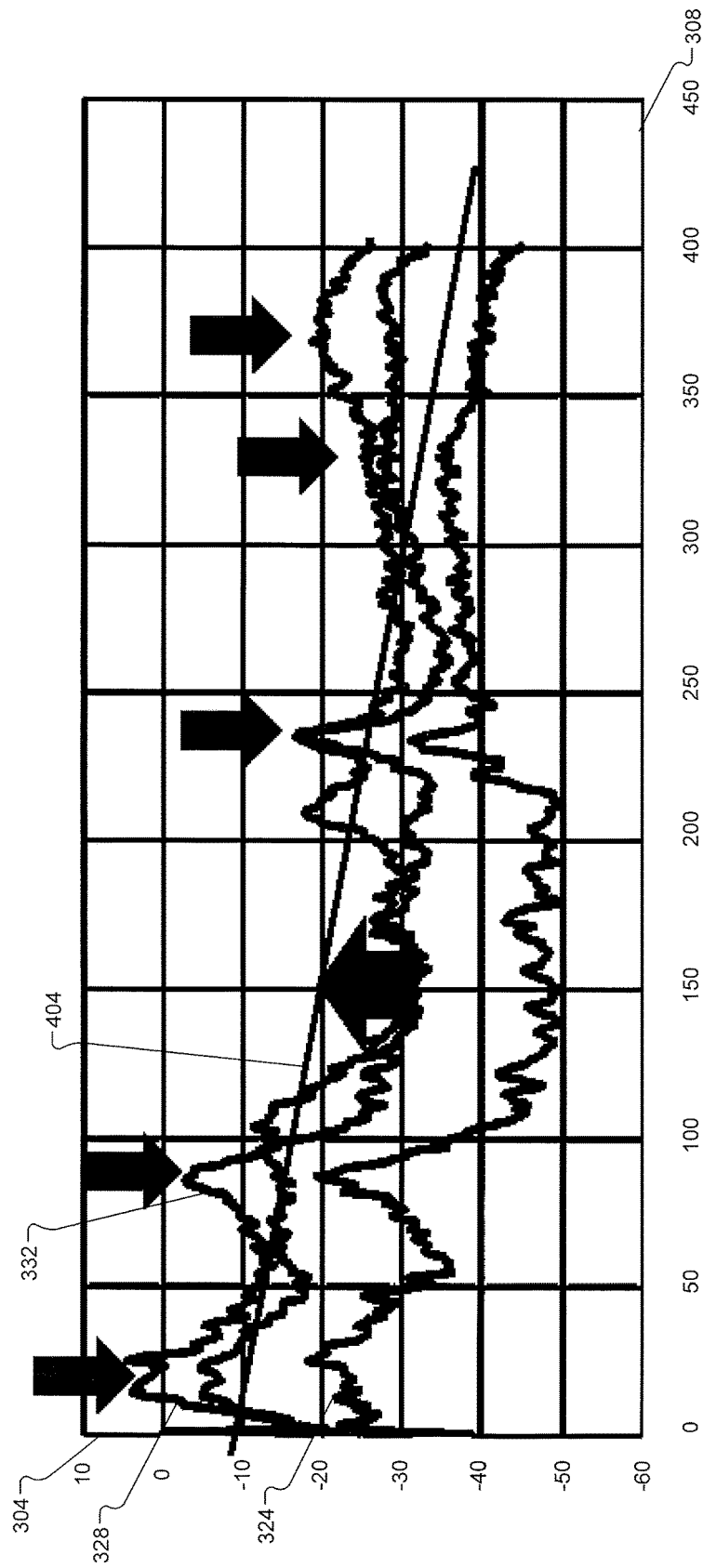

FIG. 4 includes another example graph of the magnitude of suspension acceleration 304 versus the frequency 308 of the suspension acceleration for when the audio mode 212 is in the second state. FIG. 4 also includes an example of the predetermined profile 404 of magnitude versus frequency. For example, the predetermined profile 404 may be selected for the road type and condition of the trace 332 or the trace 328.

As illustrated, the sound control module 204 sets the characteristics 208 to enhance (increase the amplitude of) the microphone signal 244 at frequencies corresponding to frequencies where the magnitude of the acceleration signal is less than the corresponding magnitude on the predetermined profile 404. For example, the sound control module 204 may set the characteristics 208 to enhance (amplify) the microphone signal 244 at frequencies corresponding to 150 Hertz (Hz) of the acceleration signal. The sound control module 204 may enhance the microphone signal 244 at a frequency based on reducing a difference between the magnitude of the acceleration signal and the corresponding magnitude on the predetermined profile 404 to zero.

The sound control module 204 also sets the characteristics 208 to attenuate (decrease the amplitude of) the microphone signal 244 at frequencies corresponding to frequencies where the magnitude of the acceleration signal is greater than the corresponding magnitude on the predetermined profile 404. For example, the sound control module 204 may set the characteristics 208 to attenuate (decrease the amplitude of) the microphone signal 244 at frequencies corresponding to approximately 235 Hz of the acceleration signal. The sound control module 204 may attenuate the microphone signal 244 at a frequency based on reducing a difference between the magnitude of the acceleration signal and the corresponding magnitude on the predetermined profile 404 to zero.

Referring back to FIG. 2, an audio driver module 260 receives the characteristics 208, the microphone signal 244, and the predetermined tones 248. The audio driver module 280 adjusts the microphone signal 244 according to the characteristics 208. The adjustment includes increasing and decreasing magnitudes of the microphone at the frequencies specified by the characteristics 208 and inserting one or more of the predetermined tones 248 at the frequencies and magnitudes specified by the characteristics 208. The audio driver module 260 applies power (e.g., from the one or more other batteries) to the speakers 184 according to the adjusted microphone signal 244 thereby outputting road sound within the passenger cabin. The road sound output may be more closely tailored to what the user may expect or desire given the road type and condition and the audio mode 212.

Figure 5:
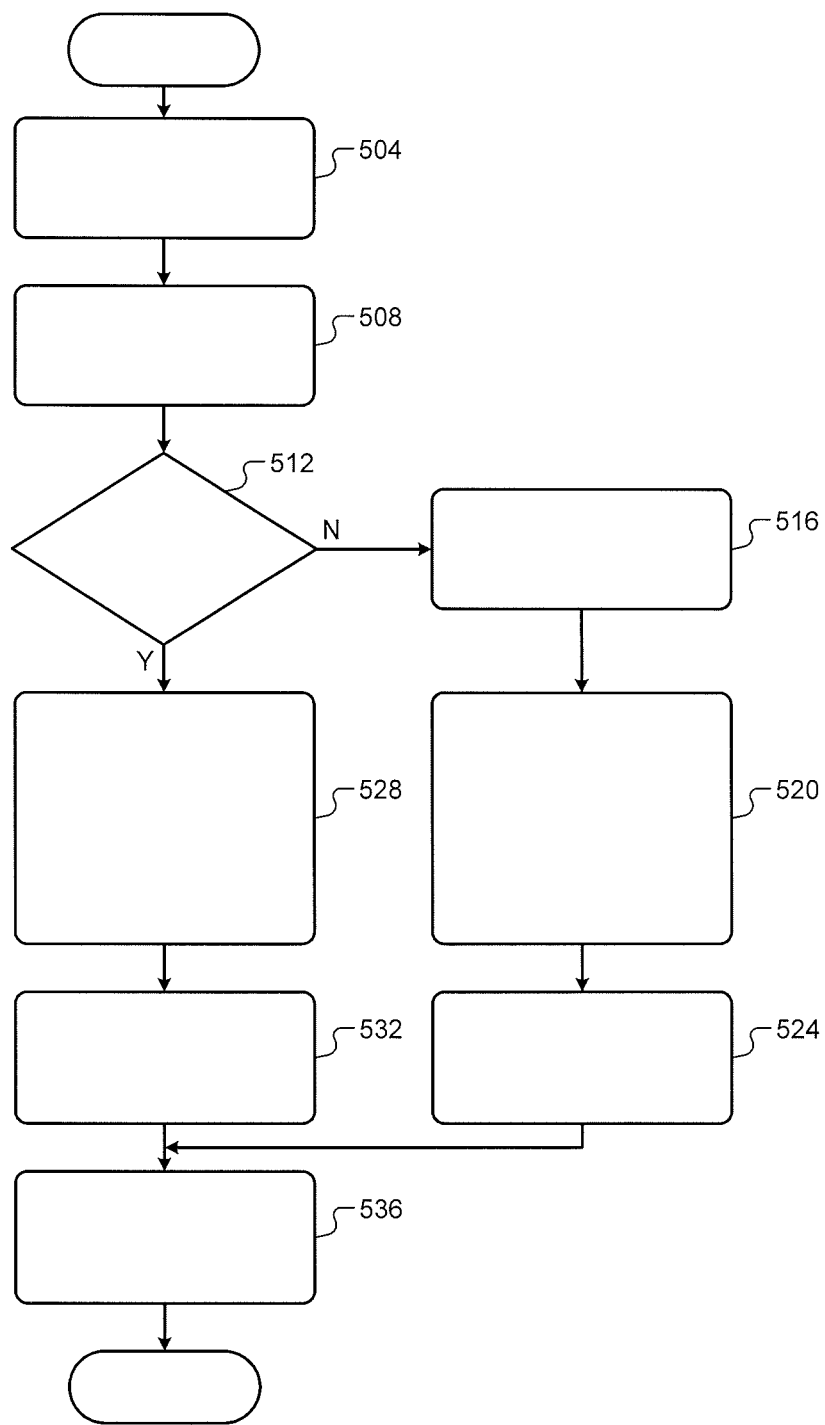
FIG. 5 is a flowchart depicting an example method of controlling sound output within a vehicle based on characteristics of a road that the vehicle is traveling over.

FIG. 5 is a flowchart depicting an example method of controlling road sound output within the passenger cabin. Control may begin with 504 where the road module 220 determines the characteristics of the road under the vehicle (e.g., type and smoothness) and sets the road signal 216 accordingly. For example, the road module 220 may set the road signal 216 to the first state when the road is concrete and smooth. The road module 220 may set the road signal 216 to the second state when the road is concrete and medium smoothness. The road module 220 may set the road signal 216 to the third state when the road is concrete and rough. The road module 220 may set the road signal 216 to the fourth state when the road is asphalt and smooth. The road module 220 may set the road signal 216 to the fifth state when the road is asphalt and medium smoothness. The road module 220 may set the road signal 216 to the sixth state when the road is asphalt and rough. The road module 220 may set the road signal 216 to the seventh state when the road is aggregate and smooth. The road module 220 may set the road signal 216 to the eighth state when the road is aggregate and medium smoothness. The road module 220 may set the road signal 216 to the ninth state when the road is aggregate and rough.

At 508, the audio mode module 236 sets the audio mode 212 to one of the first state and the second state. For example, the audio mode module 236 may set the audio mode 212 to the first state when the user audio mode 240 is set to the first state and set the audio mode 212 to the second state when the user audio mode 240 is set to the second state. Alternatively (e.g., when the user audio mode 240 is not present or not specified), the audio mode module 236 may set the audio mode 212 to the first state when at least one of the drive mode 242 is set to track and the audio mode module 236 determines that the driver of the vehicle is driving the vehicle in the track state. The audio mode module 236 may set the audio mode 212 to the second state when the drive mode 242 is set to a mode other than track and/or the audio mode module 236 determines that the driver of the vehicle is not driving the vehicle in the track state.

At 512, the sound control module 204 determines whether the audio mode 212 is set to the first state. If 512 is true, control continues with 528, which is discussed further below. If 512 is false, control transfers to 516. At 516, when the audio mode 212 is in the second state, the sound control module 204 determines the predetermined profile based on the state of the road signal 216.

At 520, the sound control module 204 sets the characteristics 208 to enhance frequencies of the microphone signal 244 corresponding to frequencies of the suspension acceleration signal 228 having magnitudes that are less than the corresponding points (magnitudes) on the predetermined profile. The sound control module may set the characteristics 208 (e.g., magnitude increases) for these frequencies based on differences between the magnitudes of those frequencies and the corresponding points on the predetermined profile, respectively. The sound control module 204 also sets the characteristics 208 to attenuate frequencies of the microphone signal 244 corresponding to frequencies of the suspension acceleration signal 228 having magnitudes that are greater than the corresponding points (magnitudes) on the predetermined profile. The sound control module may set the characteristics 208 (e.g., magnitude decreases) for these frequencies based on differences between the magnitudes of those frequencies and the corresponding points on the predetermined profile, respectively.

At 524, the audio driver module 260 adjusts the microphone signal 244 based on the characteristics 208, and control continues with 536. More specifically, the audio driver module 260 adjusts (increases and decreases) the magnitudes of the microphone signal 244 at the frequencies according to the characteristics 208. 536 is discussed further below.

At 528, when the audio mode 512 is in the first state, the sound control module 204 determines the first, second, and third predetermined frequency ranges based on the state of the road signal 216. The sound control module 204 also determines frequencies to enhance and frequencies to attenuate based on the state of the road signal 216. For example, which frequencies to enhance and which frequencies to attenuate may be predetermined and determined based on the state of the road signal 216.

Additionally or alternatively, the sound control module 204 may identify increases in the (magnitude of the) suspension acceleration signal 228 within the first, second, and third predetermined frequency ranges. The sound control module 204 may determine frequencies in the microphone signal 244 to enhance based on frequencies in the suspension acceleration signal 228 within the first predetermined frequency range where increases are identified. The sound control module 204 may determine frequencies in the microphone signal 244 to attenuate based on frequencies in the suspension acceleration signal 228 within the second and third predetermined frequency ranges where increases are identified. The sound control module may set the characteristics 208 (e.g., magnitude increases) for these frequencies, for example, based on differences between the magnitudes at those frequencies and average magnitudes within predetermined frequency ranges around those frequencies.

At 532, the sound control module 204 sets the characteristics 208 to add one or more of the predetermined tones 248 at one or more frequencies and the magnitudes of the one or more of the predetermined tones 248 to be added. The frequencies at which to add one or more of the predetermined tones may be predetermined and may be determined based on the state of the road signal 216.

Additionally or alternatively, the sound control module 204 may determine the frequencies to add one or more of the predetermined tones 248 as the midpoints between adjacent frequencies to be enhanced and/or the midpoints between adjacent frequencies to be attenuated. The magnitudes of the one or more of the predetermined tones may be predetermined and may be determined based on the state of the road signal 216. Additionally or alternatively, the sound control module 204 may, for example, set the magnitudes for the one or more predetermined tones to be added based on average magnitudes of adjacent frequencies to be attenuated or enhanced.

At 532, the audio driver module 260 adjusts the microphone signal 244 based on the characteristics 208, and control continues with 536. More specifically, the audio driver module 260 adjusts (increases and decreases) the magnitudes of the microphone signal 244 at the frequencies specified by the characteristics 208 and adds the one or more of the predetermined tones 248 at the frequencies specified by the characteristics 208. At 536, the audio driver module 260 applies power to the speakers 184 according to the (adjusted) microphone signal 244. While the example of FIG. 5 is shown as ending, FIG. 5 is illustrative of one control loop and control returns to 504.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. An audio control system of a vehicle, comprising:
a road module configured to determine a type of road over which the vehicle is traveling and a smoothness of the road and to set a state of a road signal based on the type of the road and the smoothness of the road;
a sound control module configured to, based on the state of the road signal, at least one of:
determine a first frequency and a first increase at which to increase a first magnitude of a microphone signal; and
determine a second frequency and a first decrease at which to decrease a second magnitude of the microphone signal; and
an audio driver module configured to:
receive the microphone signal from a microphone located within a passenger cabin of the vehicle;
generate an adjusted microphone signal by at least one of:
increasing the first magnitude of the microphone signal at the first frequency based on the first increase; and
decreasing the second magnitude of the microphone signal at the second frequency based on the first decrease; and
apply power to a speaker of the vehicle based on the adjusted microphone signal.

2. The audio control system of claim 1 wherein the road module is configured to determine the type of the road and the smoothness of the road based on a suspension acceleration signal measured by a suspension acceleration sensor of the vehicle.

3. The audio control system of claim 2 wherein the road module is configured to determine the type of the road and the smoothness of the road based on the suspension acceleration signal matching a predetermined suspension acceleration signal profile associated with the type of the road and the smoothness of the road.

4. The audio control system of claim 3 wherein the road module is configured to select the predetermined suspension acceleration signal profile from a group of predetermined suspension acceleration signal profiles based on the matching, and
wherein each predetermined suspension acceleration signal profile of the group of predetermined suspension acceleration signal profiles is associated with one road type and one type of smoothness.

5. The audio control system of claim 1 wherein the road module is configured to determine the type of the road and the smoothness of the road based on a global positioning system (GPS) location of the vehicle.

6. The audio control system of claim 5 wherein the road module is configured to determine the type of the road and the smoothness of the road using a database of road types and types of smoothness for a plurality of different GPS locations.

7. The audio control system of claim 1 wherein:
the sound control module is further configured to, based on the state of the road signal, at least one of:
determine a third frequency and a second increase at which to increase a third magnitude of the microphone signal; and
determine a fourth frequency and a second decrease at which to decrease a fourth magnitude of the microphone signal; and
the audio driver module is configured to further generate the adjusted microphone signal by at least one of:
increasing the third magnitude of the microphone signal at the third frequency based on the second increase; and
decreasing the fourth magnitude of the microphone signal at the fourth frequency based on the second decrease.

8. The audio control system of claim 1 wherein:
the sound control module is configured to, based on the state of the road signal, both:
determine the first frequency and the first increase at which to increase the first magnitude of the microphone signal; and
determine the second frequency and the first decrease at which to decrease the second magnitude of the microphone signal; and
the audio driver module is configured to generate the adjusted microphone signal by both:
increasing the first magnitude of the microphone signal at the first frequency based on the first increase; and
decreasing the second magnitude of the microphone signal at the second frequency based on the first decrease.

9. The audio control system of claim 8 wherein the sound control module is configured to determine the first frequency, the first increase, the second frequency, and the first decrease further based on a state of an audio mode.

10. The audio control system of claim 9 wherein:
when the audio mode is in a first state:
the sound control module is configured to determine the first frequency and the first increase based on a first increase in a suspension acceleration signal within a first predetermined frequency range; and
the sound control module is configured to determine the second frequency and the first decrease based on a second increase in the suspension acceleration signal within a second predetermined frequency range; and
when the audio mode is in a second state:
the sound control module is configured to determine the first frequency and the first increase based on a third magnitude of the suspension acceleration signal at a third frequency that is less than a first predetermined magnitude on a predetermined suspension acceleration signal profile at the third frequency; and
the sound control module is configured to determine the second frequency and the first decrease based on a fourth magnitude of the suspension acceleration signal at a fourth frequency that is greater than a second predetermined magnitude on the predetermined suspension acceleration signal profile at the fourth frequency.

11. The audio control system of claim 10 wherein the sound control module is configured to determine the predetermined suspension acceleration signal profile based on the state of the road signal.

12. The audio control system of claim 11 wherein the sound control module is configured to select the predetermined suspension acceleration signal profile from a group of predetermined suspension acceleration signal profiles, and
wherein each predetermined suspension acceleration signal profile of the group of predetermined suspension acceleration signal profiles is associated with one road type and one type of smoothness.

13. The audio control system of claim 11 wherein the sound control module is configured to select the predetermined suspension acceleration signal profile from a group of predetermined suspension acceleration signal profiles, and
wherein each predetermined suspension acceleration signal profile of the group of predetermined suspension acceleration signal profiles is associated with one road type and one type of smoothness.

14. The audio control system of claim 11 wherein, when the audio mode is in the second state:
the sound control module is configured to determine the first increase based on a difference between the third magnitude of the suspension acceleration signal at the third frequency and the first predetermined magnitude on the predetermined suspension acceleration signal profile at the third frequency; and
the sound control module is configured to determine the first decrease based on the fourth magnitude of the suspension acceleration signal at the fourth frequency that is greater than the second predetermined magnitude on the predetermined suspension acceleration signal profile at the fourth frequency.

15. The audio control system of claim 11 further comprising an audio mode module configured to selectively set the audio mode to the second state during autonomous operation of the vehicle and to selectively set the audio mode to the first state during non-autonomous operation of the vehicle.

16. The audio control system of claim 11 further comprising an audio mode module configured to set the audio mode to one of the first state and the second state based on signal indicative of user input to set the audio mode to the one of the first state and the second state.

17. The audio control system of claim 11 further comprising an audio mode module configured to set the audio mode to one of the first state and the second state based on signal indicative of user input.

18. The audio control system of claim 11 further comprising an audio mode module configured to:
determine whether the vehicle is being driven in a track state based on a lateral acceleration of the vehicle;
set the audio mode to the first state when the vehicle is being driven in the track state; and
set the audio mode to the second state when the vehicle is not being driven in the track state.

19. An audio control method for a vehicle, comprising:
determining a type of road over which the vehicle is traveling and a smoothness of the road;
setting a state of a road signal based on the type of the road and the smoothness of the road;
based on the state of the road signal and a state of an audio mode, at least one of:

determining a first frequency and a first increase at which to increase a first magnitude of a microphone signal; and determining a second frequency and a first decrease at which to decrease a second magnitude of the microphone signal;

receiving the microphone signal from a microphone located within a passenger cabin of the vehicle;

generating an adjusted microphone signal by at least one of:
- increasing the first magnitude of the microphone signal at the first frequency based on the first increase; and
- decreasing the second magnitude of the microphone signal at the second frequency based on the first decrease; and applying power to a speaker of the vehicle based on the adjusted microphone signal.

20. The audio control method of claim 19 further comprising:

when the audio mode is in a first state:
- determining the first frequency and the first increase based on a first increase in a suspension acceleration signal within a first predetermined frequency range; and
- determining the second frequency and the first decrease based on a second increase in the suspension acceleration signal within a second predetermined frequency range; and when the audio mode is in a second state:
- determining the first frequency and the first increase based on a third magnitude of the suspension acceleration signal at a third frequency that is less than a first predetermined magnitude on a predetermined suspension acceleration signal profile at the third frequency; and
- determining the second frequency and the first decrease based on a fourth magnitude of the suspension acceleration signal at a fourth frequency that is greater than a second predetermined magnitude on the predetermined suspension acceleration signal profile at the fourth frequency; and at least one of:
- selectively setting the audio mode to the second state during autonomous operation of the vehicle and selectively setting the audio mode to the first state during non-autonomous operation of the vehicle;
- selectively setting the audio mode to one of the first state and the second state based on signal indicative of user input to set the audio mode to the one of the first state and the second state;
- selectively setting the audio mode to one of the first state and the second state based on signal indicative of user input; and
- determining whether the vehicle is being driven in a track state based on a lateral acceleration of the vehicle and one of: selectively setting the audio mode to the first state when the vehicle is being driven in the track state; and selectively setting the audio mode to the second state when the vehicle is not being driven in the track state.

* * * * *